United States Patent
Nakamura

(10) Patent No.: US 6,252,650 B1
(45) Date of Patent: Jun. 26, 2001

(54) EXPOSURE APPARATUS, OUTPUT CONTROL METHOD FOR ENERGY SOURCE, LASER DEVICE USING THE CONTROL METHOD, AND METHOD OF PRODUCING MICRODEVICE

(75) Inventor: Kouji Nakamura, Kounosu (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/648,461

(22) Filed: Aug. 28, 2000

(30) Foreign Application Priority Data

Sep. 9, 1999 (JP) .................................. 11-255181
Jul. 28, 2000 (JP) ............................. 2000-228262

(51) Int. Cl.$^7$ ........................ G03B 27/72; G03B 27/54; A61N 5/00; G03G 15/04; H01S 3/00
(52) U.S. Cl. .................... 355/69; 355/35; 355/67; 355/53; 250/492.2; 399/32; 399/51; 372/38
(58) Field of Search .................... 355/35, 53, 67, 355/69; 250/492.2; 399/32, 51; 372/38

(56) References Cited

U.S. PATENT DOCUMENTS

| | | |
|---|---|---|
| 4,970,546 | 11/1990 | Suzuki et al. . |
| 5,191,374 | 3/1993 | Hazama et al. . |
| 5,627,627 | 5/1997 | Suzuki . |
| 5,657,334 | 8/1997 | Das et al. . |
| 5,728,495 | 3/1998 | Ozawa . |
| 6,005,879 | 12/1999 | Sandstrom et al. . |
| 6,067,306 * | 5/2000 | Sandstrom et al. .................. 372/38 |

* cited by examiner

Primary Examiner—Russell Adams
Assistant Examiner—Khaled Brown
(74) Attorney, Agent, or Firm—Oliff & Berridge PLC

(57) ABSTRACT

An exposure apparatus comprising an energy source which outputs a pulse exposure beam, a detector which detects energy of the exposure beam output from the energy source for every pulse, and a controller which controls energy of a pulse to be output next based on the energy of a pulse output prior to a latest output pulse detected by the detector.

12 Claims, 3 Drawing Sheets

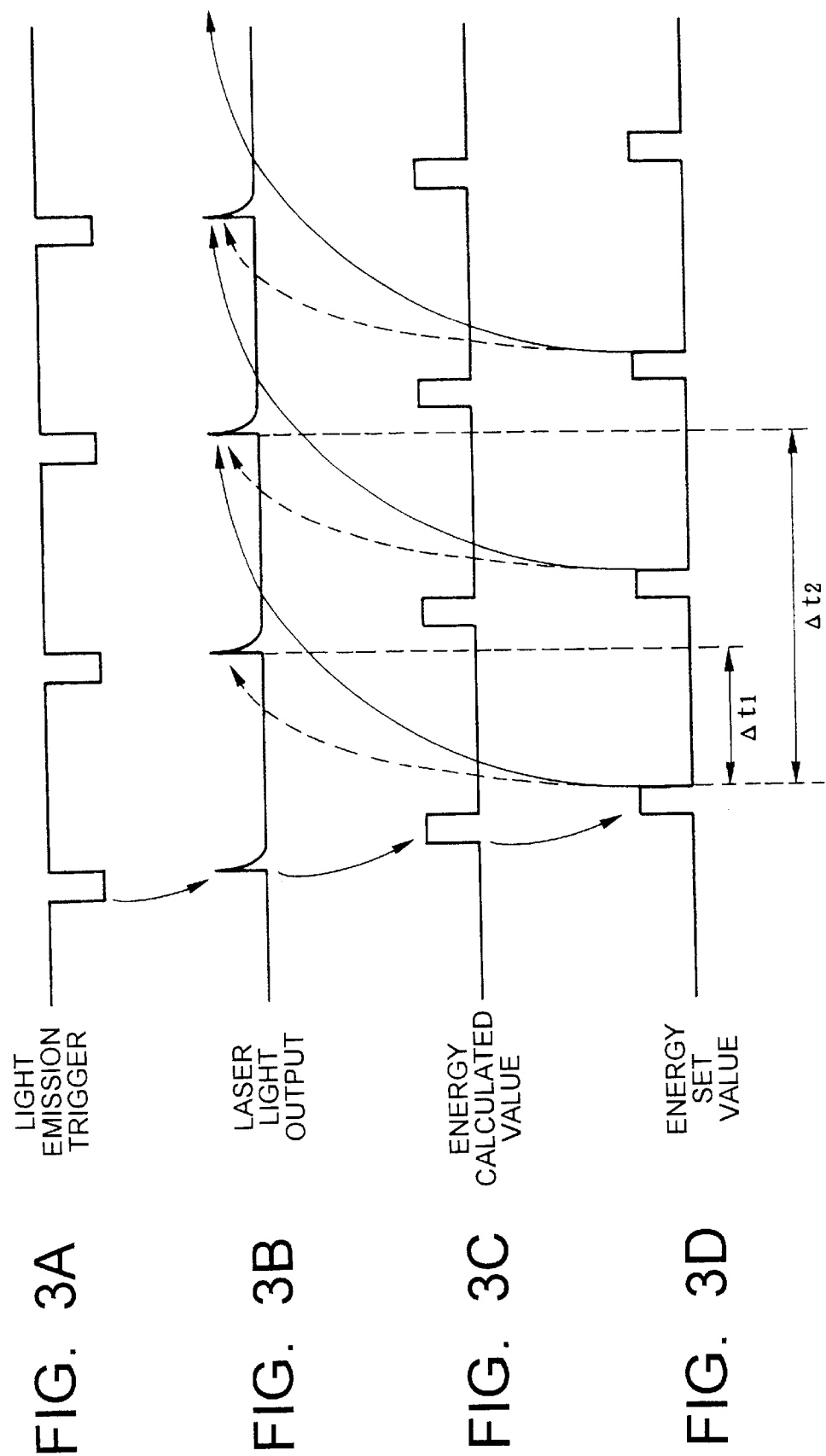
FIG. 3A LIGHT EMISSION TRIGGER
FIG. 3B LASER LIGHT OUTPUT
FIG. 3C ENERGY CALCULATED VALUE
FIG. 3D ENERGY SET VALUE

EXPOSURE APPARATUS, OUTPUT CONTROL METHOD FOR ENERGY SOURCE, LASER DEVICE USING THE CONTROL METHOD, AND METHOD OF PRODUCING MICRODEVICE

BACKGROUND OF THE INVENTION

1. Field of the Invention

The present invention relates to an exposure apparatus, an output control method for an energy source and a laser device used in a field of production of semiconductor devices, liquid crystal display devices, etc.

2. Description of the Related Art

When producing semiconductor elements, liquid crystal display elements, image pickup elements (such as a CCD), thin film magnetic heads, etc. by using photo-lithography techniques, a projection exposure apparatus for exposing a wafer by projecting an image via a projection optical system of a pattern formed on a reticle as a mask on to a wafer (or a glass plate, etc.) coated with a photo resist, etc. has been used. As one basic function of the exposure apparatus, there is an exposure dose control function for controlling an integrated exposure amount (integrated exposure energy) so that it is within an appropriate range for respective points in each shot region of the wafer.

Recently, there have been demands for increased resolution of the pattern to be projected on the wafer. To increase the resolution, a method of shortening the wavelength of the exposure light has been used. As a light source for exposure light, pulse emission type laser light sources (pulse light sources), for example, excimer laser light sources such as KrF excimer lasers and ArF excimer lasers, metal vapor laser light sources, and YAG laser light sources, are currently known to emit light of short wavelength.

However, being different from continuously luminescent light sources, such as mercury lamps, there is a characteristic that the exposure energy of an emitted pulse becomes uneven between pulses in a pulse light source. Therefore, the unevenness of the pulse energy in exposure dose control must be considered when using the pulse light source. Generally, when using the pulse light source as a light source for exposure, a minimum pulse number, or so-called minimum exposure pulse number, to be irradiated on respective points on the wafer is regulated by considering the unevenness of the pulse energy in order to control the integrated exposure amount so that it is within a predetermined permissible range.

For exposure dose control in the case of applying the pulse light source to a projection exposure apparatus which is a collective exposure type, such as a stepper, so-called cutoff control using an integrator sensor for monitoring the pulse energy of exposure light for each pulse is commonly used. In the cutoff control, an integrated exposure amount supplied to a wafer is monitored during exposure based on information from the integrator sensor, and emission of the pulse from the pulse light source is stopped at the point where the integrated exposure amount supplied to the wafer exceeds a target integrated exposure amount. There is also a so-called every-pulse control by which the pulse energy is adjusted for every pulse emission in accordance with the information from the integrator sensor.

In the every-pulse control, the above minimum exposure pulse number can be reduced comparing with that in the cutoff control.

Controlling the energy of a pulse to be emitted next from the laser light source is important in order to improve control accuracy of the integrated exposure amount supplied to the wafer. Accordingly, measurement of the energy of every pulse by the integrator sensor provided inside the exposure apparatus and control of the energy of the next pulse based on measured energy information of at least one pulse previously emitted are performed.

In recent years, since the repeated emission frequency (repeated emission cycle) of laser light sources has become higher, as explained above, controlling the energy of the next pulse based on the measured energy information of the latest pulse previously emitted is difficult because sufficient time cannot be secured until an emission of the next pulse so the controlling accuracy of the energy of the next pulse declines in some cases.

For example, when outputting an exposure beam from a laser light source at a predetermined cycle, if detected energy information of a pulse output immediately before is used, calculation of the target energy of the pulse to be output next cannot be completed in time in some cases. Alternately, power charging of the laser light source for emitting the next pulse is not completed in time in some cases if the detected energy information of a pulse output immediately before is used. Furthermore, if the detected energy information of a pulse is output immediately before, an emission of the next pulse from the laser light source will be delayed in some cases. This is caused by an actual emission delay from the laser light source after sending an emission trigger from the exposure apparatus.

SUMMARY OF THE INVENTION

An object of the present invention is to enable light exposure control at high accuracy in an exposure apparatus having an energy source for outputting pulses of an exposure beam.

Also, another object of the present invention is to provide an output control method for an energy source capable of outputting pulses having desired energy.

Still another object of the present invention is to provide a laser device capable of outputting pulses having desired energy.

Other objects of the present invention will become clear from the explanation below.

An exposure apparatus of the present invention comprises an energy source for outputting pulses of an exposure beam, a detector for detecting energy of the exposure beam output from said energy source for every pulse, and a controller for controlling energy of a pulse to be output next without using energy information of a latest output pulse and based on energy information of at least one pulse output prior to the latest output pulse detected by said detector at the time of successively outputting pulses from said energy source.

According to the above configuration, since the controller can control the energy of a pulse to be output next based on the energy information of pulses output prior to the latest output pulse, sufficient time can be used for controlling the energy of the pulse to be output next, thus, control accuracy of an integrated exposure amount supplied to a substrate is improved.

Preferably, said controller controls the energy of a pulse to be output next based on energy information detected by said detector of at least one pulse including a pulse output immediately before the latest output pulse.

According to the present invention, there is provided an exposure apparatus comprising an energy source for outputting pulses of an exposure beam, an illumination system for introducing the exposure beam from said energy source to a mask on which a pattern is formed, a projection system for projecting an image of the pattern from said mask on to a substrate.

The exposure apparatus comprises a detector for detecting energy of the exposure beam output from said energy source for every pulse in said illumination system, an exposure controller for controlling integrated exposure amount to said substrate, and an energy source controller connected to said exposure controller via a communication interface for controlling said energy source in accordance with target energy determined based on energy information detected by said detector of at least one pulse output prior to the latest output pulse during exposure of said substrate.

An output control method for an energy source of the present invention comprises a step of detecting energy of a beam output from an energy source for every pulse, and a step of controlling energy of a pulse to be output next without using detected energy information of a latest output pulse and based on detected energy information of a pulse output prior to that when pulses are successively output from said energy source.

A laser device of the present invention comprises an energy source for outputting pulses of laser light, and an energy source controller for determining target energy of a pulse to be output next based on detected energy information of at least one pulse output before the latest output pulse and controlling said energy source based on the determined target energy when successively outputting pulses from said energy source.

BRIEF DESCRIPTION OF THE DRAWINGS

These and other objects and features of the present invention will become clearer from the following description of the preferred embodiments given with reference to the attached drawings, in which:

FIG. 3A to FIG. 3D are views of waveform in the light exposure control system shown in FIG. 2.

DESCRIPTION OF THE PREFERRED EMBODIMENT

Below, the preferred embodiment of the present invention will be explained in detail. Here, the present invention will be applied to light exposure control in a step-and-scan projection exposure apparatus using an excimer laser light source as a pulse energy source.

Figure 1:
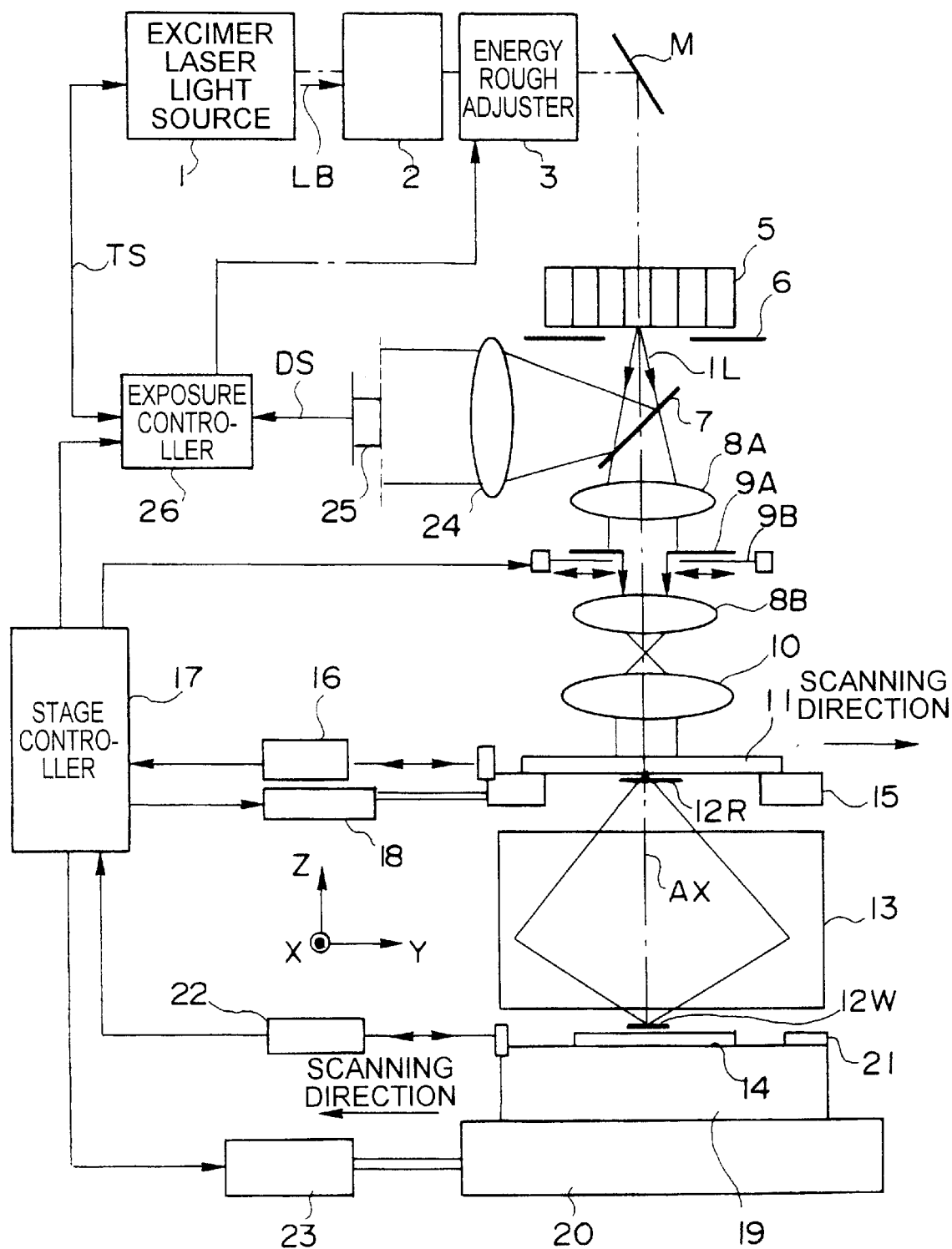
FIG. 1 is a view of the configuration of an embodiment of a step-and-scan projection exposure apparatus wherein the present invention is applied.

FIG. 1 is a view of the configuration of the step-and-scan projection exposure apparatus to which the present invention is applied. The excimer laser light source 1 outputs pulses of a laser beam LB as an exposure beam. A sectional form of the laser beam LB output from the excimer laser light source 1 is shaped by a beam-shaping optical system 2 comprising a cylinder lens and a beam expander, etc. so as to efficiently irradiate on the following fly-eye lens 5.

As the light source 1, an excimer laser light source of KrF (a wavelength of 248 nm) or ArF (a wavelength of 193 nm), etc., may be used. Note that the present invention can also be applied in cases where the pulse energy source can be a laser light source of $F_2$ (a wavelength of 157 nm), a pulse light source, such as a harmonics generator of a metal vapor laser or YAG laser, or an extreme-ultraviolet light (EUV light) beam generator such as a soft X-ray.

The laser beam LB emitted from the optical system 2 is irradiated into an energy rough adjuster 3 which is a type of energy adjuster. The rough adjuster 3 is configured that a plurality of optical filters having different transmittancy are arranged on a freely rotatable revolver. The rough adjuster 3 can switch the transmittancy with respect to the incident laser beam LB to a plurality of levels starting from 100% by rotating the revolver.

Note that the transmittancy may be more precisely adjusted by arranging the revolver and a similar revolver to that in series and using combination of the two filters.

A laser beam LB emitted from the rough adjuster 3 is irradiated on the fly-eye lens 5 via a mirror M for bending the light path. The fly-eye lens 5 forms a plurality of second light sources for illuminating a later explained reticle 11 by an almost unified illumination distribution. Note that the illumination light that passes through the fly-eye lens 5 will be referred to as a pulse illumination light IL hereinafter. On an emission surface of the fly-eye lens 5 is arranged an aperture stop 6 for an illumination system. The pulse illumination light IL emitted from the second light source in the aperture stop 6 irradiates on a beam splitter 7 having a small reflection coefficient and a high transmittancy. The pulse illumination light IL transmitted through the beam splitter 7 reaches a reticle blind 9A having a rectangular opening via a first relay lens 8A. The reticle blind 9A is arranged close to a conjugate surface with respect to a pattern surface of the reticle and regulates an illumination region on the reticle 11. Also, nearby the reticle blind 9A is arranged a movable blind 9B having an opening whose position and width are variable in the scanning direction. Unnecessary exposure of a wafer is prevented by further limiting by means of a movable blind 9B the illumination region regulated by the reticle blind 9A at the time of starting and ending a scanning exposure.

The pulse illumination light IL passes through the reticle blind 9A and the movable blind 9B and irradiates a rectangular illumination region 12R on the reticle 11 held on a reticle stage 15 via a second relay lens 8B and a condenser lens 10. A reduced image of the pattern in the illumination region 12R is projected on to a rectangular exposure region (illumination field) 12W on the wafer 14 coated with a photo-resist via a projection optical system 13 and via a projection magnification a (a is for example ¼ or ⅕), and the wafer 14 is exposed inside the exposure region 12W. The wafer 14 is a wafer of, for example, silicone or silicone on insulator (SOI), etc.

Below, an explanation will be made wherein a Z-axis is set in parallel with an optical axis AX of the projection optical system 13, the scanning direction of the reticle 11 with respect to the illumination region 12R in a plane vertical to the optical axis AX is set to be a Y-direction, and the non-scanning direction vertical to the scanning direction is set to be an X-direction.

The reticle stage 15 is driven in the Y-direction by a reticle stage drive 18. The X-coordinate, Y-coordinate and rotation angle of the reticle stage 15 measured by means of a mirror provided on the reticle stage 15 and a laser interferometer 16 are supplied to a stage controller 17. The stage controller 17 controls the position and speed of the reticle stage 15 via the reticle stage drive 18 based on the supplied coordinates, etc.

The wafer 14 is held on a Z-tilt stage 19 via a not shown wafer holder, while a stage 19 is mounted on an XY stage 20. The XY stage 20 performs positioning of the wafer 14 in the X-direction and Y-direction and moves at a constant velocity for scanning the wafer 14 in the Y-direction. Also, the Z-tilt stage 19 has a function of adjusting the position in the Z-direction to a so-called focal position and adjusting the inclination of the wafer 14 with respect to the XY-plane. The X-coordinate, Y-coordinate and rotation angle of the XY stage 20 measured by means of the mirror provided on the Z-tilt stage 19 and laser interferometer 22 are supplied to the stage controller 17. The controller 17 controls the position and speed of the XY-stage via the wafer stage drive 23 based on the supplied coordinates, etc.

An operation of the stage controller 17 is controlled by a main controller 30 (see FIG. 2) for totally controlling the overall apparatus.

During scanning exposure, in synchronization with the reticle 11 held by the reticle stage 15 being scanned in the +Y-direction (or −Y-direction) with respect to the illumination region 12R at the speed $V_R$, the wafer 14 held by the XY stage 20 via the Z-tilt stage 19 is scanned in the −Y-direction (or +Y-direction) with respect to the exposure region 12W at the speed $\alpha \cdot V_R$ ($\alpha$ is a projection magnification from the reticle 11 to the wafer 14).

Near the wafer 14 on the Z-tilt stage 19 is provided a sensor 21 comprised of a photoelectric conversion element. The light receiving surface of the sensor 21 is set at the same height with the surface of the wafer 14. A PIN type photo diode, etc. having sensitivity in the far ultraviolet range and a high response frequency for detecting a pulse illumination light may be used as the sensor 21. A detection signal of the sensor 21 is supplied via a not shown peak-hold circuit and an analogue/digital (A/D) converter to the exposure controller 26.

On the other hand, the pulse illumination light IL reflected on the beam splitter 7 is received by an integrator sensor 25 as a detector comprised of a photoelectric conversion element via a light converging lens 24. A photoelectric transform/conversion signal of the integrator sensor 25 is supplied as an output digital signal (DS) via a not shown peak-hold circuit and an A/D converter to the exposure controller 26.

The correlation coefficient of the output DS of the integrator sensor 25 and energy (exposure amount) of the pulse illumination light IL per unit area on the surface (image surface) of the wafer 14 is obtained in advance and stored in the exposure controller 26. The exposure controller 26 controls the light emission timing and light emission power, etc. of a excimer laser light source 1 by supplying control information TS to the light source 1 in synchronization with operation information of a stage system from the stage controller 17.

Furthermore, the exposure controller 26 controls the transmittancy by switching the filter of the rough adjuster 3, while the stage controller 17 controls an open/close operation of the movable blind 9B in synchronization with the operation information of the stage system.

Figure 2:
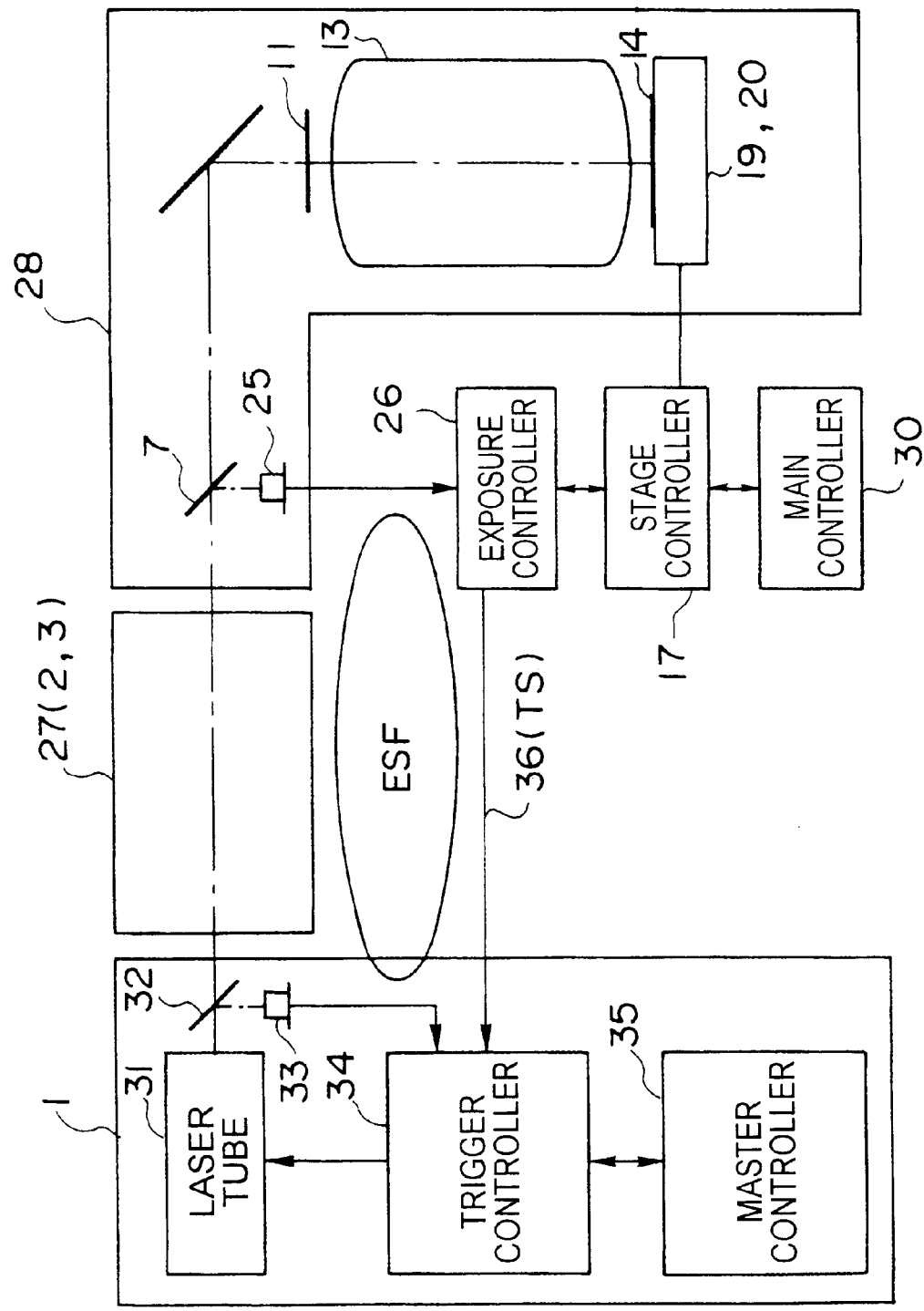
FIG. 2 is a block diagram of a light exposure control system of the exposure apparatus shown in FIG. 1.

FIG. 2 is a block diagram of an exposure dose control system of the exposure apparatus shown in FIG. 1. The excimer laser light source 1 is provided by means of an independent casing. A beam shaping optical system 2 and the energy rough adjuster 3 are housed in another casing 27. Optical parts arranged on the lower course side (wafer 14 side) from the fly-eye lens 5 (not shown in FIG. 2) and other elements composing the exposure apparatus are shown in FIG. 2 as an exposure apparatus body 28.

The excimer laser light source 1 includes a laser tube (laser resonator) 31. Pulses of the laser beam emitted from the laser tube 31 irradiate into the beam splitter 32 having a high transmittancy and very low reflection rate. The laser beam transmitted through the beam splitter 32 is supplied to the exposure apparatus body 28 via the beam shaping optical system 2 and the energy rough adjuster 3. The laser beam reflected on the beam splitter 32 irradiates into an energy monitor 33 comprised of a photoelectric conversion element as an internal sensor, and a photoelectric conversion signal from the energy monitor 33 is supplied to the trigger controller 34. Units of energy control corresponding to an output of the energy monitor 33 are for example mJ/pulse. The trigger controller 34 sets a power source voltage (charging voltage) inside the laser tube 31 by exchanging control information with the master controller 35 based on the output of the energy monitor 33 and the control information (control signal) TS from the exposure controller 26. By doing so, the pulse energy of the laser beam emitted from the laser tube 31 is set or controlled.

In the present embodiment, for example during a scanning exposure, an exposure beam is output from the laser tube 31 at a predetermined cycle (for example, repetition frequency 4 kHz) and is detected for every pulse by the integrator sensor 25. Energy information of the respective pulse detected by the integrator sensor 25 is supplied to the exposure controller 26. The exposure controller 26 calculates a target energy value of a pulse to be output next without using the energy information of the latest emitted pulse and based on the energy information of a pulse emitted immediately before that detected by the integrator sensor 25.

The exposure controller 26 generates a control signal including the calculated energy value, and the control signal is sent to the trigger controller 34 by a communication interface 36 as a part of control information TS. A high speed parallel interface can be used as the communication interface 36.

Accordingly, an energy sensor feedback system including a laser tube 31, an integrator sensor 25, an exposure controller 26, a communication interface 36 and a trigger controller 34 are configured in the present embodiment. By adopting a high speed communication interface 36 for connection between the exposure controller 26 and the trigger controller 34, response performance of control can be improved in the feedback group.

Particularly in the present embodiment, energy of a pulse to be output next is controlled without using the energy information of the latest emitted pulse and based on the energy information of the pulse emitted immediately before that detected by the integrator sensor 25 in the exposure controller 26.

FIG. 3A to FIG. 3D are views of waveform (timing chart) in the light exposure control system shown in FIG. 2. Pulses of a laser light are output from the laser tube 31 in accordance with the trigger supplied to the trigger controller 34 from the exposure controller 26. The laser light is detected by the integrator sensor 25 for every pulse. The exposure controller 26 calculates energy for every pulse based on the output of the integrator sensor 25. Furthermore, the exposure controller 26 calculates a target energy (energy set value) for the next pulse based on the calculated value and outputs the calculated value to the trigger controller 34 as control information TS. The trigger controller 34 controls the energy (a charging voltage) of the next pulse in accordance with the control information from the exposure controller 26.

The dotted lines in FIG. 3A to FIG. 3D indicate the case where the energy of the next pulse is controlled based on the energy information of the latest emitted pulse. In this case, an affordable time after the completion of the calculation of the target energy until an emission of a pulse of the target energy is Δt1. On the other hand, in the present embodiment, as shown in solid lines in FIG. 3A to FIG. 3D, the next pulse energy is controlled without using the energy information of the latest emitted pulse, and based on the energy information of a pulse immediately before that. Namely, energy information of a pulse is detected and based on the detected result, energy of a pulse after the next pulse is controlled. Accordingly, an affordable time after the completion of the calculation of the target energy until the emission of a pulse of the target energy is Δt2 (>Δt1).

As a result, in the present embodiment, since a sufficient energy control time can be secured without deteriorating the emission cycle (repetition emission frequency) of the laser tube 31, highly accurate exposure control becomes possible.

Accordingly, for example, when calculation of an energy value of a pulse to be output next cannot be in time by using a detection value of energy of the latest output pulse, the energy of the pulse to be output next can be controlled based on a detected energy value of a pulse (its previous pulse in the present embodiment) output prior to the latest output pulse.

Furthermore, when emission of an exposure beam from the laser tube cannot be in time by using a detected energy value of the latest output pulse, the energy of the pulse to be output next can be controlled based on a detected energy value of a pulse (its previous pulse in the present embodiment) output prior to the latest output pulse. Namely, as shown in FIG. 3A to FIG. 3D, although a constant delay time (oscillation delay) normally arises after the giving of a light emission trigger until the output of an exposure beam, by applying the present invention, deterioration of controlling accuracy caused by such an oscillation delay can be prevented.

Note that since an emission cycle of pulses of an exposure beam sometimes changes in accordance with an appropriate integrated exposure amount of a wafer, whether to control based on energy of the latest pulse or to control based on energy of a pulse output prior to the latest pulse may be made to be selected in accordance with an emission cycle determined for giving an appropriate light exposure on the wafer.

Also, in the above embodiment, it is made to control energy of a pulse to be output next without using energy information of the latest emitted pulse and based on energy information of a pulse emitted immediately before the latest emitted pulse, however, energy information of a plurality of pulses may be used and energy information of the pulse emitted immediately before the latest emitted pulse is not necessarily used. Namely, energy of a pulse to be output next may be controlled without using the energy information of the latest pulse and based on energy pulse of at least one pulse emitted prior to that. For example, assuming that the pulse number to be irradiated on the wafer 14 during scanning exposure is N (N is a natural number), the energy of the next pulse may be controlled not by means of the energy information of the latest emitted pulse but by using energy information of successively emitted N pulses prior to that. Also, when the least exposure pulse number Nmin (Nmin is a natural number) is regulated, the energy of the next pulse may be controlled not by means of the energy information of the latest emitted pulse but by using energy information of successively emitted Nmin pulses prior to that.

Also, in the above embodiment, a target energy of the next pulse was obtained in the exposure controller 26 of the exposure apparatus, but it may be made to calculate a target charging voltage value for emitting the next pulse. Also, by inputting energy information of at least one pulse detected by the integrator sensor 25 to the master controller 35 of the excimer laser light source 1, it may be made to obtain the target energy of the next pulse or the target charging voltage value for emitting the next pulse in the master controller 35 in the excimer laser light source 1.

Note that the embodiments explained above were described to facilitate the understanding of the present invention and not to limit the present invention. Accordingly, elements disclosed in the above embodiments include all design modifications and equivalents belonging to the technical field of the present invention.

For example, in the above embodiment, an explanation was made of a step-and-scan reduction projection type scanning exposure apparatus (a scanning stepper), however, the present invention may be applied in the same way, for example, to a step-and-repeat reduction projection type exposure apparatus (a stepper) wherein an exposure illumination light is irradiated on the whole surface of the reticle pattern in a state that the reticle and wafer are still, and one sectional region (a shot region) on the wafer on which the reticle pattern is transferred is subjected to a collective exposure, a mirror projection or proximity exposure apparatus, and all other forms of exposure apparatuses.

Also, the present invention may be applied not only to exposure apparatuses to be used for producing semiconductor devices, liquid crystal displays, thin film magnetic heads and image pickup devices (CCD, etc.), but also applied to exposure apparatuses for transferring circuit patterns on glass plates, silicone wafers, etc. for producing reticles or masks.

As explained above, according to the above embodiment, since it is made to control energy of a pulse to be emitted next by detecting energy of pulses output from an energy source for every pulse, without using detected energy information of the latest output pulse and based on detected energy information of a pulse output prior to that, a pulse having a desired energy can be emitted at a desired timing. When it is applied to an exposure apparatus, controlling accuracy of an integrated exposure amount is improved as explained above, so sufficient line width uniformity, etc. can be obtained.

This disclosure relates to the matter contained in Japanese Patent Applications No. 11-255181 filed on Sep. 9, 1999 and No. 2000-228262 filed on Jul. 28, 2000. All of that disclosure is incorporated here by reference.

What is claimed is:

1. An exposure apparatus comprising:
   an energy source which outputs pulses of an exposure beam;
   a detector which detects energy of the exposure beam output from said energy source for every pulse; and
   a controller which controls energy of a pulse to be output next without using energy information of the latest output pulse and based on energy information of at least one pulse output prior to a latest output pulse detected by said detector at the time of successively outputting pulses from said energy source.

2. An exposure apparatus according to claim 1, wherein said controller controls energy of a pulse to be output next based on energy information detected by said detector of at least one pulse including a pulse output immediately before the latest output pulse.

3. An exposure apparatus according to claim 1, wherein, at the time of outputting an exposure beam at a predetermined cycle from said energy source, in a case where calculation of a target energy of the next pulse cannot be in time by using detected energy information of a latest output pulse, said controller controls energy of the pulse to be output next without using the detected energy information of a latest output pulse.

4. An exposure apparatus according to claim 1, wherein, at the time of outputting an exposure beam at a predetermined cycle from said energy source, in a case where charging of said energy source cannot be in time by using detected energy information of a latest output pulse, said controller controls energy of the pulse to be output next without using the detected energy information of the latest output pulse.

5. An exposure apparatus according to claim 1, wherein, at the time of outputting an exposure beam at a predetermined cycle from said energy source, in a case where emission of an exposure beam from said energy source cannot be in time by using detected energy information of a latest output pulse, said control apparatus controls energy of the pulse to be output next without using the detected energy information of the latest output pulse.

6. An exposure apparatus comprising:

an energy source which outputs pulses of an exposure beam;

an illumination system which introduces the exposure beam from said energy source to a mask on which a pattern is formed;

a projection system which projects an image of the pattern from said mask onto a substrate;

a detector which detects energy of the exposure beam output from said energy source for every pulse in said illumination system;

an exposure controller which controls integrated exposure amount to said substrate; and an energy source controller connected to said exposure controller via a communication interface which controls said energy source in accordance with target energy determined without using energy information of a latest output pulse and based on energy information detected by said detector of at least one pulse output prior to the latest output pulse during exposing said substrate.

7. A method of producing a microdevice using the exposure apparatus according to claim 6.

8. An output control method for an energy source comprising:

a step of detecting energy of a beam output from a energy source for every pulse; and a step of controlling energy of a pulse to be output next without using detected energy information of a latest output pulse and based on detected energy information of a pulse output prior to that when pulses are successively output from said energy source.

9. A laser device comprising:

an energy source which outputs pulses of a laser light; and an energy source controller which determines target energy of a pulse to be output next without using energy information of a latest output pulse and based on detected energy information of at least one pulse output before the latest output pulse and controlling said energy source based on the determined target energy when successively outputting pulses from said energy source.

10. A device producing method including a lithography process in which an exposure beam emitted from an energy source is guided to a mask having a pattern formed thereon and the image of the pattern on the mask is projected onto a substrate which will thus be exposed, the method comprising steps of:

successively emitting an exposure beam as pulses from the energy source;

detecting energy of the exposure beam emitted from the energy source for every pulse;

controlling emission of a next pulse from the energy source without using energy information of a latest output pulse and based on detected energy information of at least one pulse output prior to the latest output pulse when the exposure beam is successively emitted from the energy source.

11. An output control method for an energy source as set forth in claim 8, wherein when controlling energy of a pulse to be output next, it can be selected whether the energy information of the latest output pulse should be used or not.

12. An exposure apparatus as set forth in claim 6, wherein the communication interface includes a parallel interface.

* * * * *